United States Patent
Akimoto

(10) Patent No.: US 8,084,974 B2
(45) Date of Patent: Dec. 27, 2011

(54) INVERTER DEVICE

(75) Inventor: Shinichi Akimoto, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 252 days.

(21) Appl. No.: 12/634,603

(22) Filed: Dec. 9, 2009

(65) Prior Publication Data
US 2010/0085001 A1    Apr. 8, 2010

Related U.S. Application Data

(63) Continuation of application No. PCT/JP2008/060258, filed on Jun. 4, 2008.

(30) Foreign Application Priority Data

Jul. 2, 2007   (JP) ................................. 2007-173752

(51) Int. Cl.
*H02P 27/00* (2006.01)
(52) U.S. Cl. ........... 318/400.3; 363/80; 363/97; 363/98; 323/217; 323/219; 323/208; 323/218; 323/233
(58) Field of Classification Search ............... 318/400.3; 363/80, 97, 98; 323/217, 218, 219, 233, 323/208
See application file for complete search history.

(56) References Cited

U.S. PATENT DOCUMENTS 5,311,419 A * 5/1994 Shires .............................. 363/65
5,481,166 A * 1/1996 Moreira .................... 318/400.04
5,504,667 A * 4/1996 Tanaka et al. .................... 363/37
5,783,917 A * 7/1998 Takekawa .................. 318/400.1
6,115,274 A * 9/2000 Mao ................................ 363/89
6,232,730 B1* 5/2001 Doyama et al. .......... 318/400.04
7,274,161 B2* 9/2007 Mori et al. ................ 318/400.36
7,285,930 B2* 10/2007 Weinmann et al. ...... 318/400.31

FOREIGN PATENT DOCUMENTS

| JP | 01-126192 | 5/1989 |
| JP | 04-069066 | 3/1992 |
| JP | 06-121544 | 4/1994 |
| JP | 2006-296008 | 10/2006 |

\* cited by examiner

*Primary Examiner* — Rita Leykin
(74) *Attorney, Agent, or Firm* — Ditthavong Mori & Steiner, P.C.

(57) ABSTRACT

There is provided an inverter device capable of simplifying the circuit structure, lowering the cast, and downsizing of the device. The inverter device detects a switching change of an inverter by a pulse and is equipped with a pulse signal detector capable of detecting a motor residual voltage or a phase and a detector for detecting a residual voltage or a phase. The inverter device includes a voltage detector, a circuit for detecting a pulse signal based on a comparison between a phase voltage detection value per one phase output from the voltage detector and a first reference voltage value, a circuit for detecting a line residual voltage based on phase voltage detection values of two phases output from the voltage detector, and a circuit for detecting a line phase based on a comparison between the line residual voltage and a second reference voltage value.

4 Claims, 2 Drawing Sheets

INVERTER DEVICE

CROSS-REFERENCE TO RELATED APPLICATIONS

The present application is a continuation application of PCT/JP2008/060258, filed Jun. 4, 2008, which claims priority to Japanese Patent Application No. 2007-173752, filed Jul. 2, 2007. The contents of these applications are incorporated herein by reference in their entirety.

BACKGROUND OF THE INVENTION

1. Field of the Invention

The preset invention relates to an inverter device that detects an inverter output voltage and detects a motor residual voltage or its phase.

2. Discussion of the Background

There is an inverter device described in Japanese Laid-open Patent Publication No. 6-121544. The inverter device consists of a voltage dividing circuit for dividing a DC voltage Vdc by half, a diode bridge that is connected in anti-parallel with a detection power source (drive power source) in which two DC power sources are connected in series, an output voltage of an inverter and a divided voltage are input, a comparator for comparing the output voltage and the divided voltage, and a photo-coupler that is turned on and off by an output of the comparator connected to the detection power source via a resistance. The inverter device is capable of detecting on and off of switching elements of an upper arm and a lower arm of an inverter main circuit, that is, an inverter output voltage with approximately the half of a DC input voltage by a high speed.

Further, there is an inverter device described in Japanese Laid-open Patent Publication No. 2006-296008. In the inverter device, a voltage polarity detection circuit consists of a voltage dividing resistance, a resistance connected with the voltage dividing resistance in series, and a comparator for polarity discrimination for detecting polarities of the voltages of the both ends of the series resistance. The inverter device is capable of detecting a residual voltage polarity by the voltage polarity detection circuit between a DC link circuit and a motor line by generating a line potential of an induction motor at the DC link circuit by turning on any one of semiconductor switching elements when the induction motor is in a free run state due to an instantaneous power failure or the like.

SUMMARY OF THE INVENTION

According to one aspect of the present invention, there is provided an inverter device including a DC power source for supplying DC power, an inverter for converting the DC power into AC power, the inverter being constituted by a semiconductor switching element and a freewheeling diode connected in anti-parallel with the semiconductor switching element, a voltage detector for detecting phase voltages of the inverter, the voltage detector being connected between the DC power source and a motor that is a driving control target, a pulse signal detection circuit for comparing a phase voltage detection value of one phase and a first reference voltage value, and for outputting a pulse signal obtained from a result of the comparing, a motor voltage detection circuit for detecting a line residual voltage or an induced voltage of the motor based on phase voltage detection values of two phases, and a phase detection circuit for detecting a line phase based on a comparison between the line residual voltage and a second reference voltage value.

BRIEF DESCRIPTION OF THE DRAWINGS

A more complete application of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
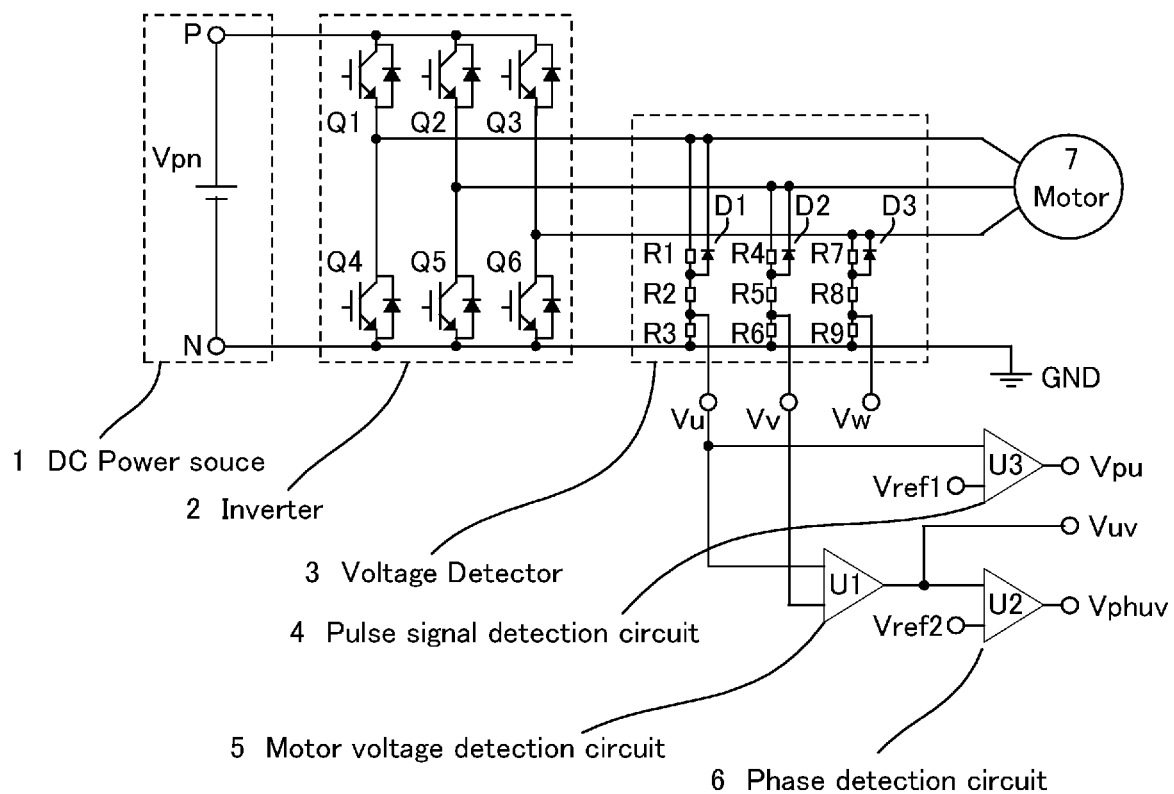
FIG. 1 is a configuration diagram schematically showing a main part of an inverter device according to an embodiment of the invention.

Embodiments will now be described with reference to the accompanying drawings, wherein like reference numerals designate corresponding or identical elements throughout the various drawings.

Hereinafter, an embodiment of the invention will be described with reference to the drawings.

FIG. 1 is a configuration diagram schematically showing a main part of an inverter device according to the invention. In FIG. 1, reference numeral 1 denotes a DC power source, 2 denotes an inverter, 3 denotes a voltage detector, 4 denotes a pulse signal detection circuit, 5 denotes a motor voltage detection circuit, 6 denotes a phase detection circuit, and 7 denotes a motor that is driven by the inverter device.

The voltage detector 3 is equipped with three voltage dividing resistances (for example R1, R2, R3 for U phase) connected in series between each phase (U, V, W phases) and an N line of the DC power source 1, and a diode for fast response of detection voltage (for example D1 for U phase) connected to an output line in parallel with the voltage dividing resistance (for example, R1 for U phase) connected to the output line. In U phase as an example, the inverter output voltage can be detected by monitoring the voltage of the other end different from the end connected to the N line of the DC power source 1 among the both ends of the voltage dividing resistance R3.

A comparator U3 that compares a reference voltage $V_{ref1}$ (instruction voltage for voltage pulse generation) and a U phase detection voltage Vu constitutes the pulse signal detection circuit 4, an operational amplifier U1 that calculates the difference between the U phase detection voltage Vu and a V phase detectopm voltage Vv constitutes the motor voltage detection circuit 5, and a comparator U2 that compares the output of the operational amplifier U1 and another reference voltage $V_{ref2}$ (instruction voltage for phase detection) constitutes the phase detection circuit 6.

Herein, an example of U phase is described. As for V phase and W phase, there are also equipped with one operational amplifier and two comparators.

Figure 2:
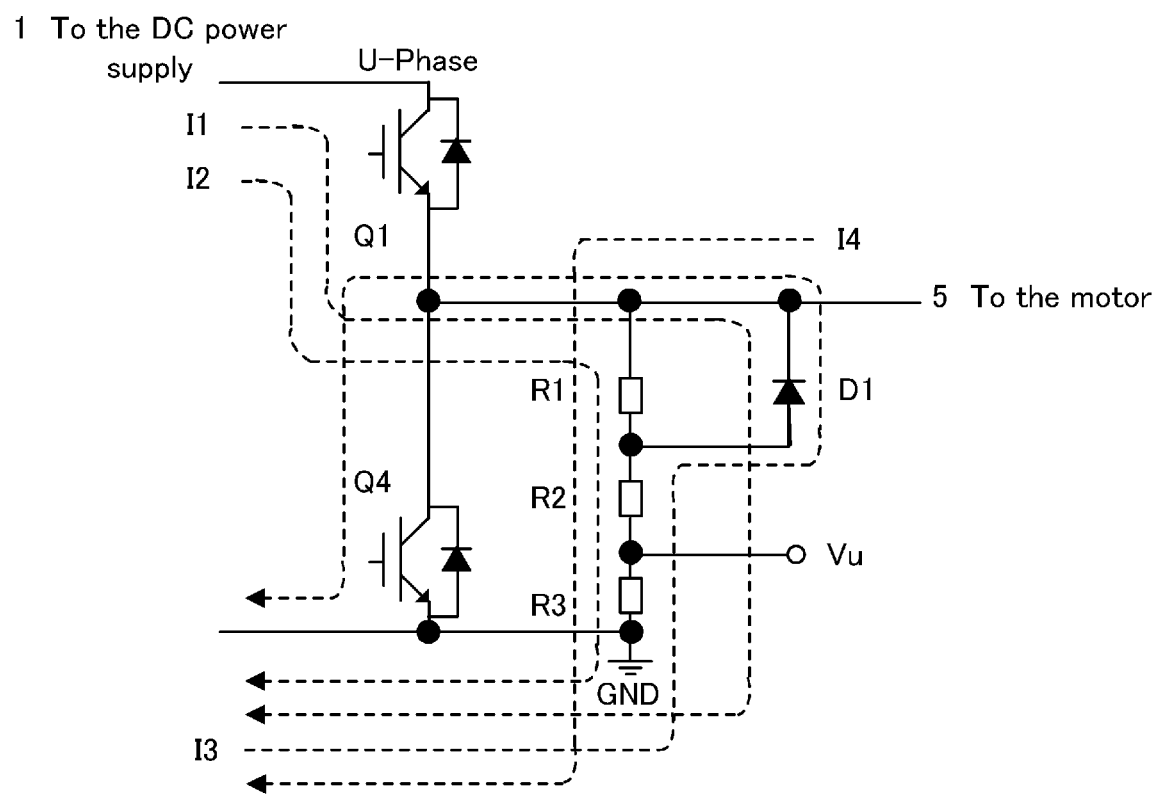
FIG. 2 is a diagram showing an operation (U-phase) of a voltage detector of FIG. 1.

FIG. 2 is a diagram (U phase) showing an operation of the voltage detector 3 in FIG. 1. In a rise transition period when a switching element Q1 is turned on during the motor 7 is driven by the inverter device, a current flows along I1 as a route. That is, the current flows via a terminal capacitance between the anode and the cathode of the diode D1, and the voltage dividing resistances R2, R3. Accordingly, the U phase detection voltage Vu that rises at a high speed can be obtained.

In a steady period after the switching element Q1 is turned on, a current flows along I2 as a route. That is, the current flows via the voltage dividing resistances R1, R2, R3, and the U phase voltage Vu that is determined by a ratio of the voltage dividing resistances is output from the inverter.

In a steady period after the switching elements Q1 and Q4 are turned off, a current flows along I4 as a route. That is, the current flows via the voltage dividing resistances R1, R2, R3, and the U phase voltage Vu that is determined by a ratio of the voltage dividing resistances is output.

In a decay transition period when the switching element Q1 is turned off and the switching element Q4 is turned on, a current flows along I3 as a route. That is, the current flows via the voltage dividing resistances R2, R3 and the diode D1 in the forward direction, and by being pulled down with the voltage dividing resistor, the U phase detection voltage Vu that decays at a high speed can be obtained.

In the case of a freewheeling mode, a freewheeling current is restrained by the voltage dividing resistor R2 so as not to break the diode D1 and the resistor R3 caused by an excessive freewheeling current.

By structuring the voltage detector 3 in this manner, a high speed pulse response in a transition period and the U phase detection voltage Vu determined by the ratio of the voltage dividing resistances in a steady period can be obtained.

Herein, an example of U phase is described. As for V phase and W phase, a V phase detection voltage Vv and a W phase inverter output voltage Vw can be also obtained.

From the detected U phase detection voltage Vu and V phase detection voltage Vv, a residual voltage Vuv, a phase Vphuv, and a pulse signal Vpu are detected by using the operational amplifier U1 and the comparators U2, U3.

Similarly, by using operational amplifiers and comparators not shown, residual voltages Vvw, Vwu, phases Vphvw, Vphwu, pulse signals Vpv, Vpw are detected.

The need for detecting the residual voltage or the phase will be described below.

Among power conversion devices for driving an induction motor by a variable speed, there is a power conversion device that restarts an induction motor after power source recovery and executes a continuity operation when the induction motor becomes a free run state an instantaneous power failure. The power conversion device employs the method of detecting the number of rotations of the induction motor in a free run state, and continuing the operation by an automatic pull-in when restart conditions are prepared.

In one concrete method, there is a power conversion device that restarts an induction motor by detecting a residual voltage of the induction motor and detecting the number of rotation or the rotating direction based on the residual voltage. In another concrete method, there is a power conversion device that restarts an induction motor by flowing a short-circuit current by simultaneously turning on switching elements in an upper arm or a lower arm of an inverter during free run and by detecting the rotation number or rotating direction at the timing at which the polarity of the short-circuit current is inverted after the switching elements are made to turned off.

That is, in order to detect the rotation number or the rotating direction of the induction motor in a free run state, the residual voltage or the phase which do not require a relatively high speed detection are detected.

Inverter output voltages (induced voltages in a free run state) having phase differences of 120 degrees are generated in U, V, W phases, so that the voltages are detected and the values that are the differences of the voltages calculated by operational amplifiers become residual voltages between phases. Further, when the output of the operational amplifier (residual voltage between phases) and the reference voltage (instruction voltage for phase detection) are compared by the comparator, the level of the phase difference between the phases is detected. Note that the reference voltage (instruction voltage for phase detection) is, for example, the value preliminarily set by converting the phase difference which should be detected into a voltage value.

The need for detecting the pulse signal is to reduce rotation ripples of the induction motor as before.

When the inverter output voltage of each phase and the reference voltage (instruction voltage for voltage pulse generation) in a rise transition period when the switching element Q1 is turned on are compared by the comparator, since the inverter output voltage of each phase rises and decays with a high speed as described above, a high speed pulse detection is possible. The reference voltage (instruction voltage for voltage pulse generation) herein is, for example, a preliminarily set value of the voltage value which should be detected. When on and off of the switching element are detected at a high speed by approximately the half of the DC input voltage, the reference voltage (instruction voltage for voltage pulse generation) is the value of approximately the half of the DC input voltage.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. An inverter device comprising:
    a DC power source for supplying DC power;
    an inverter for converting the DC power into AC power, the inverter being constituted by a semiconductor switching element and a freewheeling diode connected in anti-parallel with the semiconductor switching element;
    a voltage detector for detecting phase voltages of the inverter, the voltage detector being connected between the inverter and a motor that is a driving control target;
    a pulse signal detection circuit for comparing a phase voltage detection value per one phase output from the voltage detector and a first reference voltage value, and for outputting a pulse signal obtained from a result of the comparing;
    a motor voltage detection circuit for detecting a line residual voltage or an induced voltage of the motor based on phase voltage detection values of two phases output from the voltage detector, and
    a phase detection circuit for detecting a line phase based on a comparison between the line residual voltage and a second reference voltage value.

2. The inverter device according to claim 1, wherein the voltage detector includes a first resister, a second resistor, a third resistor, and a diode, an end of the first resistor being connected between the DC power source and the motor, the other end of the first resistor being connected with the second resistor, an end of the second resistor being connected with the first resistor, the other end of the second resistor being connected with the third resistor, an end of the third resistor being connected with the second resistor, the other end of the third resistor being connected with an N line of the DC power source, an anode of the diode being connected between the DC power source and the motor, and a cathode of the diode being connected at a portion at which the first resistor and the second resistor are connected.

3. The inverter device according to claim 1, wherein the pulse signal detection circuit compares the phase voltage detection value of one phase and the first reference voltage value in a rise transition period or a decay tran sition period when the semiconductor switching elements of one phase are turned on or turned off.

4. The inverter device according to claim 1, wherein the motor voltage detection circuit and the phase detection circuit execute the detection in a steady period when the semiconductor switching elements per one phase are turned on or turned off.

* * * * *